United States Patent
Tiemeijer et al.

(10) Patent No.: US 11,810,751 B2
(45) Date of Patent: Nov. 7, 2023

(54) METHOD OF IMAGING A SPECIMEN USING A TRANSMISSION CHARGED PARTICLE MICROSCOPE

(71) Applicant: FEI Company, Hillsboro, OR (US)

(72) Inventors: Peter Tiemeijer, Eindhoven (NL);
Evgeniia Pechnikova, Eindhoven (NL);
Rudolf Geurink, Eindhoven (NL);
Abhay Kotecha, Eindhoven (NL);
Jamie McCormack, Eindhoven (NL)

(73) Assignee: FEI Company, Hillsboro, OR (US)

(*) Notice: Subject to any disclaimer, the term of this patent is extended or adjusted under 35 U.S.C. 154(b) by 57 days.

(21) Appl. No.: 17/354,986

(22) Filed: Jun. 22, 2021

(65) Prior Publication Data
US 2021/0407762 A1 Dec. 30, 2021

(30) Foreign Application Priority Data
Jun. 25, 2020 (EP) .................................... 20182306

(51) Int. Cl.
*H01J 37/22* (2006.01)
*H01J 37/05* (2006.01)
(Continued)

(52) U.S. Cl.
CPC ............ *H01J 37/222* (2013.01); *H01J 37/05* (2013.01); *H01J 37/244* (2013.01); *H01J 37/26* (2013.01);
(Continued)

(58) Field of Classification Search
CPC ........ H01J 37/222; H01J 37/05; H01J 37/244; H01J 37/26; H01J 2237/221;
(Continued)

(56) References Cited

U.S. PATENT DOCUMENTS

| 8,405,027 B2 * | 3/2013 | Lazar | ..................... H01J 37/28 250/311 |
| 8,878,130 B2 * | 11/2014 | Inada | ..................... H01J 37/21 250/311 |

(Continued)

FOREIGN PATENT DOCUMENTS

JP 6318986 B2 5/2018

OTHER PUBLICATIONS

Anonymous: "Energy filtered transmission electron microscopy—Wikipedia", Dec. 19, 2019 (Dec. 19, 2019), XP055753167, Retrieved from the Internet: URL:https://en.wikipedia.org/w/index.php?title=Energy_filtered_transmission_electron_microscopy&oldid=931498637 [retrieved on Nov. 23, 2020].

(Continued)

*Primary Examiner* — David A Vanore (57) ABSTRACT

The disclosure relates to a method of imaging a specimen using a transmission charged particle microscope, said method comprising providing a specimen, and providing a charged particle beam and directing said charged particle beam onto said specimen for generating a flux of charged particles transmitted through the specimen. The method comprises the step of generating and recording a first energy filtered flux of charged particles transmitted through the specimen, wherein said first energy filtered flux of charged particles substantially consists of non-scattered and elastically scattered charged particles. The method as disclosed herein comprises the further step of generating and recording a second energy filtered flux of charged particles transmitted through the specimen, wherein said second energy filtered flux of charged particles substantially consists of inelastically scattered charged particles. Said first and second recorded energy filtered flux are then used for imaging said specimen with increased contrast.

15 Claims, 7 Drawing Sheets

(51) Int. Cl.
  *H01J 37/244* (2006.01)
  *H01J 37/26* (2006.01)
(52) U.S. Cl.
  CPC ... *H01J 2237/221* (2013.01); *H01J 2237/226* (2013.01)
(58) Field of Classification Search
  CPC .............. H01J 2237/226; H01J 37/265; H01J 2237/24455; H01J 2237/24485; H01J 2237/24495; H01J 2237/2617; G01N 23/04; G01N 23/20; G01N 2223/03; G01N 2223/05
  See application file for complete search history.

(56) References Cited

U.S. PATENT DOCUMENTS

| | | | |
|---|---|---|---|
| 2003/0006373 A1* | 1/2003 | Koguchi | H01J 37/2955 250/311 |
| 2003/0193024 A1* | 10/2003 | Takagi | H01J 37/026 250/307 |
| 2011/0284744 A1* | 11/2011 | Zewail | H01J 37/228 250/311 |
| 2012/0001069 A1* | 1/2012 | Kashihara | H01J 37/28 250/310 |
| 2012/0012747 A1* | 1/2012 | Lazar | H01J 37/244 250/311 |
| 2012/0025074 A1* | 2/2012 | Barbi | H01J 37/244 250/361 R |
| 2012/0037802 A1* | 2/2012 | Kneedler | H01J 37/244 250/306 |
| 2012/0120226 A1* | 5/2012 | de Jonge | H01J 37/20 348/80 |
| 2012/0241611 A1* | 9/2012 | Kaji | H01J 37/244 250/311 |
| 2021/0305013 A1* | 9/2021 | Tiemeijer | H01J 37/10 |

OTHER PUBLICATIONS

EP20182306.9, Extended European Search Report, dated Jan. 29, 2021, 17 pages.
EP20182306.9, Partial European Search Report, dated Dec. 3, 2020, 15 pages.
Florea I et al., "3D Analysis of the Morphology and Spatial Distribution of Nitrogen in Nitrogen-Doped Carbon Nanotubes by Energy-Filtered Transmission Electron Microscopy Tomography", Journal of the American Chemical Society, American Chemical Society, US, vol. 134, No. 23, Jun. 13, 2012 (Jun. 13, 2012), pp. 9672-9680, XP002691621, ISSN: 0002-7863, DOI: 10.1021/JA304079D [retrieved on May 22, 2012].
Hibino M. et al.: "Observations of Atomic Number Dependent Contrast Using Signal Manipulation in High Voltage STEM", Journal of Electron Microscopy, vol. 35, No. Supplement, 1986, pp. 919-920, XP009525033.
Lehmpfuhl G et al., "Electron microscopic channelling imaging of thick specimens with medium-energy electrons in an energy-filter microscope", Ultramicroscopy, Elsevier, Amsterdam, NL, vol. 31, No. 2, Oct. 1, 1989 (Oct. 1, 1989), pp. 161-168, XP025709122, ISSN: 0304-3991, DOI: 10.1016/0304-3991(89)90209-X [retrieved on Oct. 1, 1989].
Lionel C G et al., "Transmission electron microscopy of unstained hybrid Au nanoparticles capped with PPAA (plasma-polyallylamine): Structure and electron irradiation effects", Micron, Pergamon, Oxford, GB, vol. 67, Jun. 20, 2014 (Jun. 20, 2014), pp. 1-9, XP029067631, ISSN: 0968-4328, DOI: 10.1016/J.MICRON.2014.06.004.
Ploc R A et al., "Energy-loss microscopy of ZrO"2", MICRON (1969), PERGAMON, vol. 6, No. 1-2, Jan. 1, 1975 (Jan. 1, 1975), pp. 65-72, XP023126901, ISSN: 0047-7206, DOI: 10.1 016/0047-7206(75)90008-4 [retrieved on Jan. 1, 1975].
Taya S et al., "Development Of Gamma-Type Energy Filtering Tem", Journal of Electron Microscopy, Japanese Society for Electron Microscopy, Tokyo, JP, vol. 45, No. 4, Aug. 1, 1996 (Aug. 1, 1996), pp. 307-313, XP000629643, ISSN: 0022-0744.

* cited by examiner

METHOD OF IMAGING A SPECIMEN USING A TRANSMISSION CHARGED PARTICLE MICROSCOPE

FIELD OF THE INVENTION

The invention relates to a method of imaging a specimen using a transmission charged particle microscope, and more particularly, to imaging cryo frozen specimen using the transmission charged particle microscope.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as a so-called "dual-beam" apparatus (e.g. a FIB-SEM) that additionally employs a Focused Ion Beam (FIB), allowing supportive activities such as ion-beam milling or Ion-Beam-Induced Deposition (IBID). The skilled person will be familiar with the different species of charged particle microscopy.

In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a relative scanning motion of the electron beam and the specimen.

Several use cases exist in transmission electron microscopy (TEM) in which the electron beam is moved or scanned over the specimen.

One example is Single Particle Analysis (SPA). In this workflow, the specimen contains a grid with many circular holes each containing a foil of ice with copies of the biological particle to be imaged. Each ice foil is about 2 μm diameter, and the foils are at a pitch of about 5 μm. The stage moves to the centre of the hole, and 2 to 6 different beam-image shifts of ca. 0.5 μm are used to acquire 2 to 6 images, each image covering an area of ca. 0.5×0.5 μm². In this context, a beam-image shift means combined deflection of the illuminating beam above the specimen and of the image beam below the specimen, such that, after the double deflection, the beam is on-axis in the imaging system downstream of the specimen, and such that a part of the specimen is imaged which is not on-axis. Then the stage moves to the next hole (which is typically 5 μm away) and the procedure is repeated. This process may be repeated hundreds or even thousands of times, thus generating a plurality of images.

BRIEF DESCRIPTION OF THE DRAWINGS

FIG. 5d shows a combination of the images obtained in FIG. 5b-5c, wherein FIG. 5c is added to FIG. 5b;

FIG. 7 shows a combination of the images obtained in FIG. 5b-5c, wherein FIG. 5c is subtracted from FIG. 5b.

In the Figures, where pertinent, corresponding parts are indicated using corresponding reference symbols. It should be noted that, in general, the Figures are not to scale.

DETAILED DESCRIPTION

In Single Particle Analysis (SPA), the 3D structure of a biological particle, such as a protein or a virus, is reconstructed from this plurality of images, wherein each single image may contain tens of copies of this same biological particle. One of the steps in this process involves recognizing and locating the particles in the plurality of images. The contrast of these particles is (very) low, because the particles and the ice in which they are embedded both consist of light elements (N, C, O, H). This makes it difficult to recognize and identify the particles in the image.

Traditional methods for boosting contrast are defocusing (CTF theory teaches that this increases the transfer of low spatial frequencies) or applying a phase plate. The first method has the disadvantage that it reduces the information at high resolution. The latter has the disadvantage that, in practice, all available phase plates in some way block part of the intensity of the beam.

It is therefore an object of the present invention to provide a method for increasing the contrast in images obtained in a transmission charged particle microscope.

To this end, the invention provides a method of imaging a specimen using a transmission charged particle microscope as defined in claim 1.

The method as defined herein is characterized in that it comprises the step of generating and recording a first energy filtered flux of charged particles transmitted through the specimen, wherein said first energy filtered flux of charged particles substantially consists of non-scattered and elastically scattered charged particles. The first energy filtered flux of charged particles enhances the contrast of different areas in the specimen, such as for example between particles and the ice in which they are embedded.

The method as defined herein is further characterized in that it comprises the step of generating and recording a second energy filtered flux of charged particles transmitted through the specimen, wherein said second energy filtered flux of charged particles substantially consists of inelastically scattered charged particles. Because of the small but noticeably difference between different regions in the ratio of charged particles that scattered inelastically and the charged particles that did not scatter or did scatter elastically, the second energy filtered flux of charged particles contains information on different areas in the specimen, such as for example of the particles and the ice in which they are embedded, and this can be used to further increase the contrast of an image obtained with the method.

The method combines the information from both said first and second recorded energy filtered fluxes for imaging said specimen with an increased contrast. With this, the object of the invention is achieved.

Further embodiments and advantages will be described below.

The method as defined herein is based on the insight that between different regions in a specimen there exists a small but noticeably difference in the ratio of charged particles that scatter inelastically and the charged particles that did not scatter or did scatter elastically. This is, for example, the case in between ice and particles in a SPA specimen. Here inelastic scattering means that the charged particle in the beam, when scattering on the specimen, does not only transfer part of its kinetic energy to the specimen because of the momentum transfer (which, in case the charged particle is an electron, is unnoticeable small because of the huge difference in mass between an electron and the atoms in the specimen) but also transfers energy due to an internal excitation of the electrons or of the atoms in the specimen. Such internal excitation can comprise (in order of decreasing energy transfer) a so-called core loss (which happens when a bound electron in a core shell of an atom in the specimen is excited to an outer shelf or to the vacuum), or a plasmon excitation (which is a collective excitation of the valence electrons), or a bandgap transition (when an electron of the valence band is excited to the conduction band), or a phonon excitation (which is a collective vibration of the atoms in the specimen). The typical energy transfers associated with these processes are 100 eV . . . 2000 eV for core losses, 10 eV . . . 40 eV for plasmon excitations, 2 eV . . . 6 eV for band gap transitions, and 0.01 eV . . . 0.2 eV for phonon excitations.

In contrast to this, elastic scattering means that the charged particle in the beam, when scattering in the specimen, does not create any internal excitation of the electrons or of the atoms in the specimen. It may be noted that for the thin specimens (10 nm . . . 30 nm) as usually employed in the transmission electron microscope, most of the electrons in the illuminating beam do not scatter or scatter elastically with the specimen. Only a small fraction of typically 5% . . . 20% of the electrons scatters inelastically, and most of these inelastic scatter events are plasmon excitations.

Often, the combined flux of the non-scattered charged particles and the elastically scattered charged particles is referred to as the elastic signal or elastic flux or elastic image.

Further, the method employs a spectroscopic apparatus for analysing the energy that the charged particles transferred or lost while interacting with the specimen, and specifically, for creating an image of the specimen using only charged particles that experienced a specific energy loss. In the context of electron microscopy, such apparatus is usually referred to as an Electron Energy Loss Spectroscopy (EELS) module.

The first energy filtered flux may be a so-called Zero-Loss Peak (ZLP) filtered image, in which all electrons that have incurred some energy-loss in the specimen are filtered out of the image. The prior art understanding is that these electrons that have incurred energy-loss (the inelastically scattered electrons) are out-of-focus in the image because of their different energy, and that this out-of-focus signal gives a fuzzy background in the image that reduces the signal-to-noise and hence reduces the visibility of the particles in the ice. According to this prior art understanding, ZLP-filtering will boost contrast for thick specimens (say >100 nm) in which significant inelastic scattering occurs (say >50%) but not for thins specimens (say <30 nm) in which only a small amount of inelastic scattering occurs (say <20%). Inventors found, however, that ZLP-filtering improves contrast even for very thin specimens (<30 nm). As will be demonstrated later on, the boost of contrast in SPA as obtained by ZLP-filtering does not come from the removal of the fuzzy background, but instead from the significant difference in inelastic scattering between the particle and the surrounding ice in which it is embedded.

The second energy filtered flux may be a so-called Zero-Loss Peak (ZLP) blocked image. Inventors found that the ZLP-blocked image does carry some powerful information. In SPA, for example, the inelastic signal is higher at the position of the particles. This increase in signal may be used for enhancing contrast in the image. Logically, this increase of intensity of the inelastic signal is accompanied by a corresponding decrease of intensity in the elastic signal. This decreased intensity (together with the high-frequency information) makes the particles recognizable in the ZLP-filtered image.

In an embodiment, during the step of generating and recording said first energy filtered flux of charged particles, use is made of a first dose.

Said first dose may equal a maximum dose the specimen can stand before losing structural integrity, such as, for example, equal or greater than 40 electrons/$Å^2$.

In an embodiment, during the step of generating and recording said second energy filtered flux of charged particles, use is made of a second dose. The second dose may be different from the first dose, but may in an embodiment be equal as well.

In an embodiment, said step of generating and recording a first energy filtered flux of charged particles is performed first, and said step of generating and recording a second energy filtered flux of charged particles is performed later.

Here, it is conceivable that the second dose is at least equal to said first dose, such as, for example, at least 40 e/$Å^2$.

Said recorded second energy filtered flux of charged particles may be used for locating areas of interest within the specimen. The areas of interest may, in case the specimen contains a plurality of sample particles. The specimen may be a cryo frozen and the sample particles may be embedded in ice.

In an embodiment, the method may comprise the step of subtracting the recorded second energy filtered flux of charged particles from said recorded first energy filtered flux of charged particles. This may comprise the step of forming an image of the first and/or second energy filtered flux of charged particles, and subtracting the images to obtain the image of the specimen. Other ways of subtracting are conceivable as well.

During the subtracting, use may be made of a scaling factor on said recorded second energy filtered flux of charged particles. The scaling factor may be tuned to achieve maximum contrast in the final specimen image.

As described before, the specimen may comprise a plurality of sample particles. The method comprises, in an embodiment, the step of forming a three-dimensional (3D) reconstruction of a sample particle, wherein use is made of said first and second energy filtered flux of charged particles.

According to an aspect, a spectroscopic apparatus is provided. The spectroscopic apparatus as defined herein comprises a dispersive device for receiving a flux of charged particles and dispersing said flux of charged particles according to their energy loss, and a detecting system for detecting at least part of the dispersed flux of charged particles.

As defined herein, the spectroscopic apparatus is arranged for:

generating and recording a first energy filtered flux of charged particles that substantially consists of non-scattered and elastically scattered charged particles; and generating and recording a second energy filtered flux of charged particles that substantially consists of inelastically scattered charged particles.

The first energy filtered flux and said second energy filtered flux may be used to create images of the sample. Said spectroscopic apparatus may be arranged, in an embodiment, to create such images.

With this, the contrast between the particles in the sample and their surroundings in the images created out of the detected fluxes may be increased, as described above.

The spectroscopic apparatus may comprise one or more slit elements for generating said first and/or second energy filtered flux of charged particles.

According to an aspect, a transmission charged particle microscope is provided. Said transmission charged particle microscope comprises:

A charged particle beam source for emitting a charged particle beam;

A specimen holder for holding a specimen;

An illuminator for directing the charged particle beam emitted from the charged particle beam source onto the specimen; and A control unit for controlling operations of the transmission charged particle microscope.

As defined herein, the transmission charged particle microscope is arranged for:

generating and recording a first energy filtered flux of charged particles that substantially consists of elastically scattered charged particles;

generating and recording a second energy filtered flux of charged particles that substantially consists of inelastically scattered charged particles; and generating an image of the specimen based on the first energy filtered flux and the second energy filtered flux.

The transmission charged particle microscope may comprise the spectroscopic apparatus as defined herein.

Figure 1:
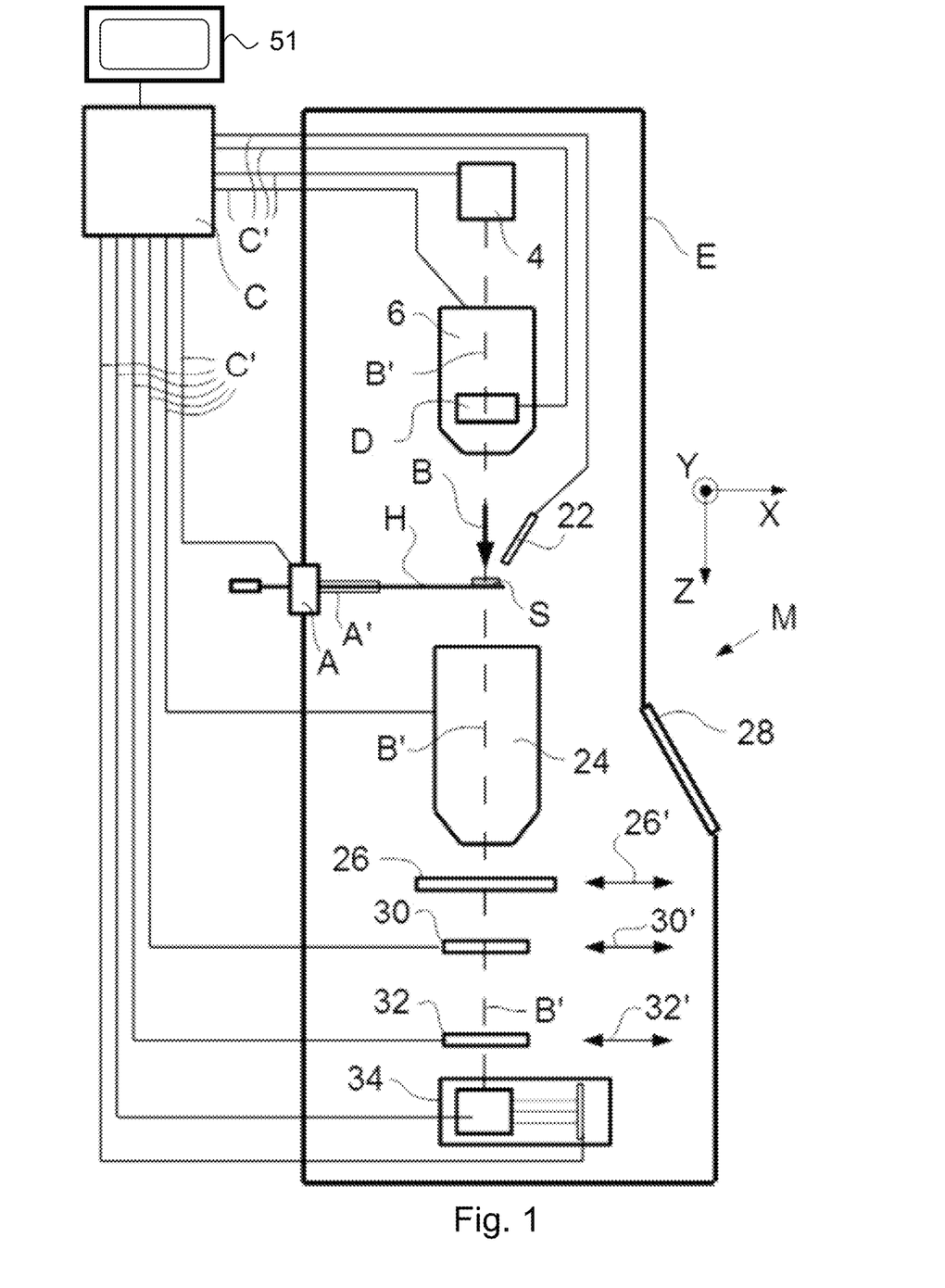
FIG. 1 shows a longitudinal cross-sectional view of a charged-particle microscope.

FIG. 1 is a highly schematic depiction of an embodiment of a transmission charged particle microscope M, which, in this case, is a TEM/STEM (though, in the context of the present disclosure, it could just as validly be an ion-based or proton microscope, for example). In FIG. 1, within a vacuum enclosure E, an electron source 4 (such as a Schottky emitter, for example) produces a beam (B) of electrons that traverse an electron-optical illuminator 6, serving to direct/focus them onto a chosen part of a specimen S (which may, for example, be (locally) thinned/planarized). This illuminator 6 has an electron-optical axis B', and will generally comprise a variety of electrostatic/magnetic lenses, (scan) deflector(s) D, correctors (such as stigmators), etc.; typically, it can also comprise a condenser system (the whole of item 6 is sometimes referred to as "a condenser system").

The specimen S is held on a specimen holder H. As here illustrated, part of this holder H (inside enclosure E) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the specimen S to be irradiated/imaged/inspected by the electron beam traveling along axis B' (and/or allows scanning motion to be performed as an alternative to beam scanning [using deflector(s) D], and/or allows selected parts of the specimen S to be machined by a (non-depicted) focused ion beam, for example).

The (focused) electron beam B traveling along axis B' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) module, for instance; in such a case, an image could be constructed using basically the same principle as in a SEM. However, alternatively or additionally, one can study electrons that traverse (pass through) the specimen S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc.

In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller C and displayed on a display device (not depicted), such as a flat panel display, for example. When not required, camera 30 can be retracted/withdrawn (as schematically indicated by arrows 30') to get it out of the way of axis B'.

STEM recorder 32. An output from recorder 32 can be recorded as a function of (X,Y) scanning position of the beam B on the specimen S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis B' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (which may be a combined controller and processor) C is connected to various illustrated components via control lines (buses) C'. Controller can be connected to a computer screen 51, which may be provided with a user interface (UI). This controller C can provide a variety of functions, such as synchronizing actions, providing setpoints, processing signals, performing calculations, and displaying messages/information on a display device (not depicted). It will be understood that the (schematically depicted) controller C may be (partially) inside or outside the enclosure E, and may have a unitary or composite structure, as desired. The skilled artisan will understand that the interior of the enclosure E does not have to be kept at a strict vacuum; for example, in a so-called "Environmental TEM/STEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, recorder 32, spectroscopic apparatus 34, etc.

As defined herein, the transmission charged particle microscope M, comprises:
- A charged particle beam source 4 for emitting a charged particle beam B;
- A specimen holder H for holding a specimen S;
- An illuminator 6 for directing the charged particle beam B emitted from the charged particle beam source 4 onto the specimen S; and
- A control unit C for controlling operations of the transmission charged particle microscope M.

The transmission charged particle microscope M as defined herein is arranged for generating and recording first and second energy filtered fluxes of charged particles that are transmitted through the specimen, as will be discussed in more detail below. The transmission charged particle microscope M as defined herein may comprise a spectroscopic apparatus 34 that is arranged for generating said first and second energy filtered fluxes of charged particles.

Figure 2:
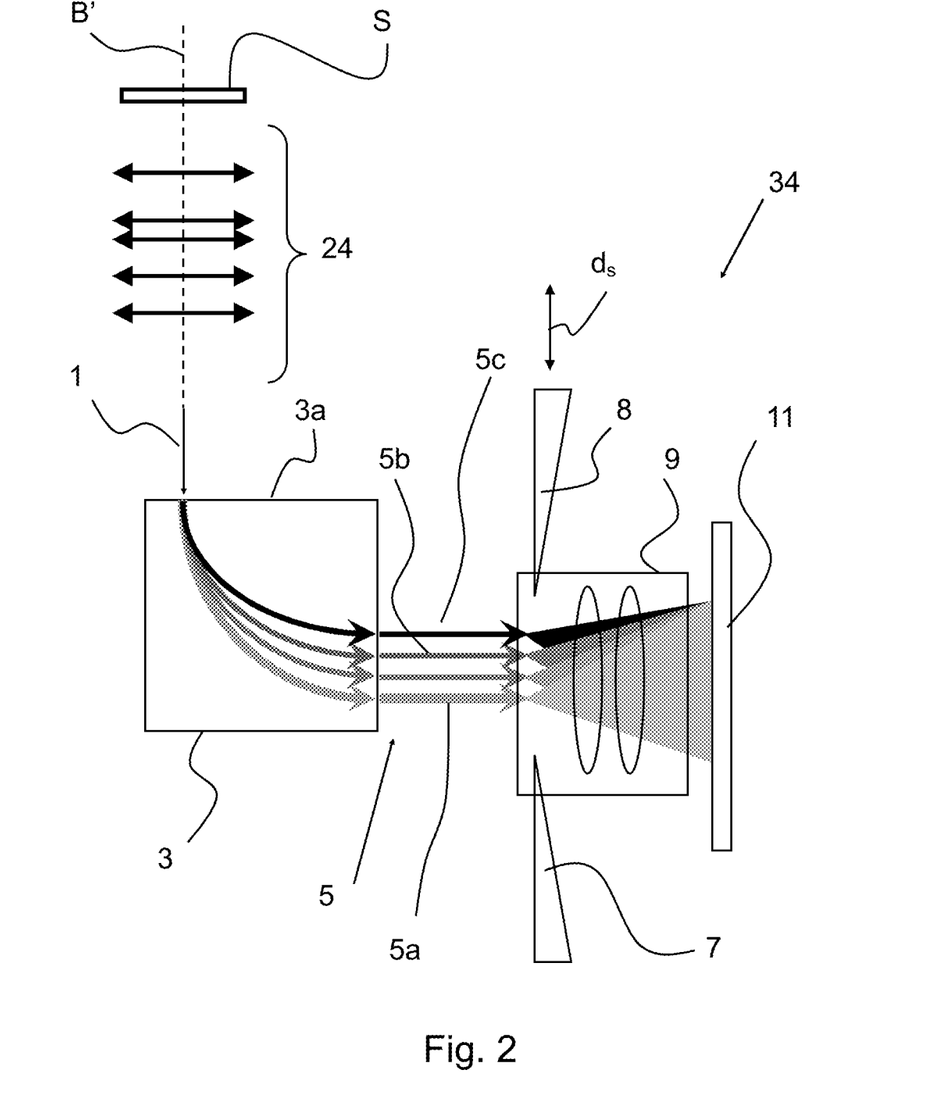
FIG. 2 shows a detailed view of a spectroscopic apparatus as defined herein, in a non-filtering setting.

Now turning to FIG. 2, details of such a spectroscopic apparatus 34 are shown. FIG. 2 shows an enlarged and more detailed view of an embodiment of the spectroscopic apparatus 34 in FIG. 1. In FIG. 2, A flux 1 of electrons (which has passed through specimen S and imaging system 24) is shown propagating along electron-optical axis B'. This flux 1 enters a dispersing device 3 ("electron prism"), where it is dispersed (fanned out) into an energy-resolved (energy-differentiated) array 5 of spectral sub-beams, which are distributed along a dispersion direction; for illustration purposes, three of these sub-beams are labelled 5a, 5b and 5c in FIG. 2.

Downstream of the dispersing device 3, the array 5 of sub-beams encounters post-dispersion electron optics 9, where it is magnified/focused, for example, and ultimately directed/projected onto detector 11 for imaging energy filtered fluxes of charged particles that are transmitted through the specimen S. Such imaging can be done by adjusting the optics 9 such that an image in the plane at the entrance of spectroscopic apparatus is imaged on the detector 11. This is energy filtered transmission electron microscopy (EFTEM). Alternatively, this imaging can be done more indirectly by adjusting the optics 9 such that an image of the dispersed (fanned out) spectral sub-beams is imaged on the detector, as to form an electron energy loss spectrum (EELS) of the interactions of the electron beam in the specimen. By scanning a focused beam across the sample and recording EELS spectra at each position, an energy filtered image can be reconstructed from the recorded spectra a posteriori. This alternative method is known as scanning transmission electron microscopy (STEM) EELS. However, inventors found that the EFTEM mode is easier to use because it does not require careful tuning and focusing of the illuminating beam. The various settings in FIGS. 2 and 3 and 4 all apply to the EFTEM mode. It should be noted that the detector 11 is known to those skilled in the art, and that the microscope and/or the method as defined herein are in principle not limited to the use of a specific detector. In the EFTEM mode, spectroscopic apparatus 34 comprises a slit for generating energy filtered fluxes of charged particles. The slit may comprise one or more slit elements 7, 8 (also known as slit edges or slit knives). In the embodiment shown in FIG. 2, the spectroscopic apparatus 34 comprises two slit elements 7, 8 that can be used to filter parts of the fluxes of the sub-beams 5a, 5b, 5c. The use of a single slit element, or the use of more than two slit elements is conceivable as well. In the embodiment shown, the two slit elements 7, 8 are movable in a first direction $d_s$, wherein the first direction $d_s$ has at least a component perpendicular to the direction of propagation of the array 5 of sub-beams, or is substantially perpendicular thereto. The two slit elements 7, 8 may be movable together, although in an embodiment each of the two slit elements 7, 8 can be independently moved. The slit elements 7, 8 allow a precise selection of the sub-beams 5a, 5b, 5c to be imaged on the detector 11. In the method as defined herein, a first and second energy filtered flux of charged particles is generated and recorded. Although the slit elements 7, 8 may be used in this, other ways of achieving a similar result are conceivable as well, as will be apparent to those skilled in the art.

In FIG. 2, the slit elements 7, 8 are moved out of the way, hence no filtering of any of the sub-beams 5a-5c takes place, and an image comprising all spectral information can be formed on the detector 11 using optical elements in the post-dispersion electron optics 9.

Figure 3:
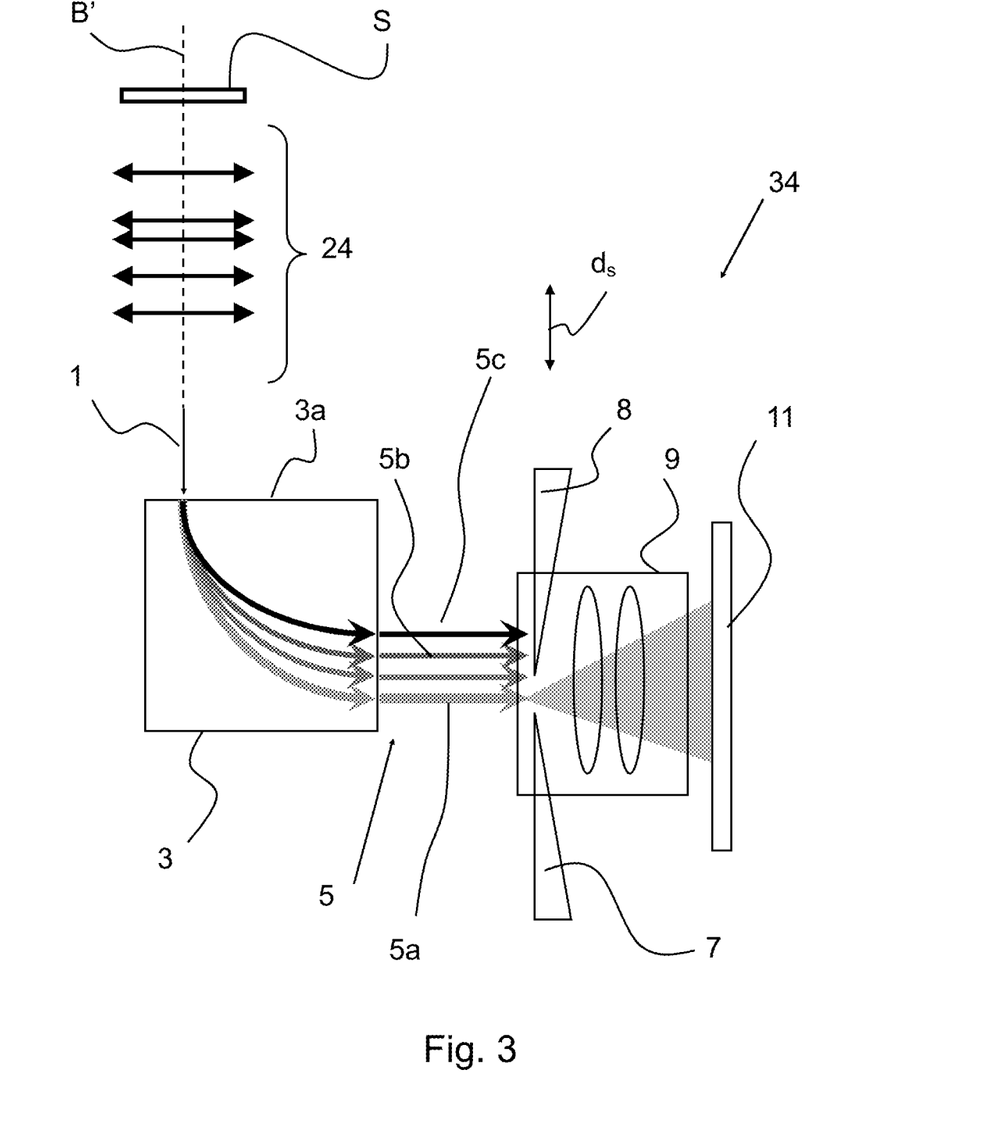
FIG. 3 shows the spectroscopic apparatus of FIG. 2 in a first energy filtered setting as defined herein.
Figure 4:
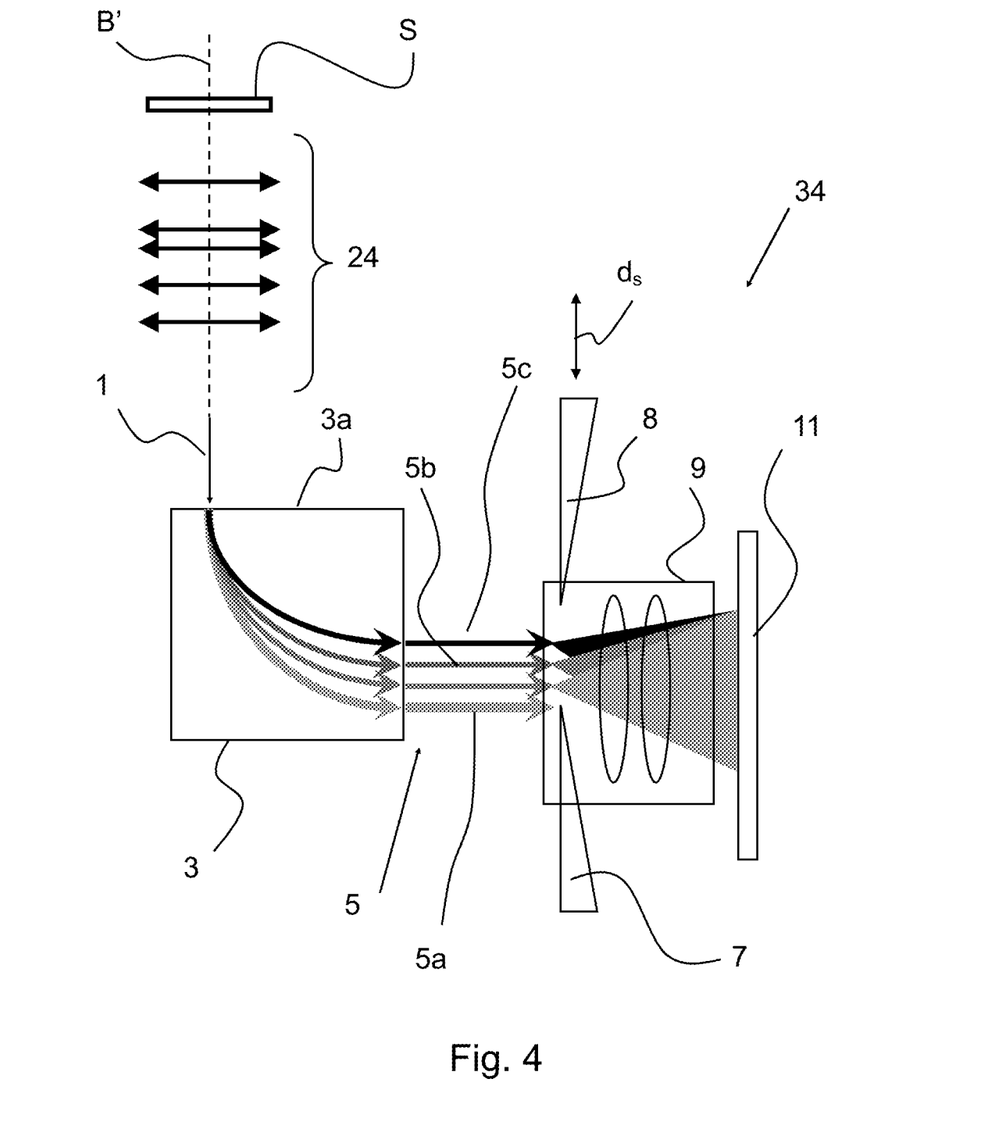
FIG. 4 shows the spectroscopic apparatus of FIG. 2 in a second energy filtered setting as defined herein.

Now turning to FIG. 3 and FIG. 4, it is shown how a first and second energy filtered flux of charged particles is generated and recorded in the EFTEM mode.

In FIG. 3, the slit elements 7, 8 are moved in a corresponding first position for generating a first energy filtered flux of charged particles. In this case, sub-beam 5a is filtered (i.e. passed through), and other sub-beams 5b, 5c are blocked. Optic elements in the post-dispersion electron optics 9 are used to form an image containing spectral information of sub-beam 5a only. This way, a first energy filtered flux of charged particles is generated and recorded.

In FIG. 4, the slit elements 7, 8 are moved to a corresponding second position for generating a second energy filtered flux of charged particles. In this case, sub-beam 5a is blocked, and other sub-beams 5b, 5c are being passed through to the detector 11.

As defined herein, the first energy filtered flux of charged particles, as shown in FIG. 3, substantially consists of non-scattered and elastically scattered charged particles. In the embodiment shown, the step of generating and recording a first energy filtered flux of charged particles comprises so-called Zero-Loss Peak (ZLP) filtering, wherein the first energy filtered flux of charged particles comprises non-scattered and elastically scattered charged particles. With this, an image of the specimen S with increased contrast is obtained.

As defined herein, the second energy filtered flux of charged particles, as shown in FIG. 4, substantially consists of inelastically scattered charged particles. In the embodiment shown, the slit elements 7, 8 are positioned such that they block sub-beam 5a (the ZLP sub-beam). Hence, the method may comprise the step of so-called Zero-Loss Peak (ZLP) blocking. The image obtained with the second energy filtered flux of charged particles may be used to increase the contrast of the specimen as well. Use may be made of the first and second recorded energy filtered flux for imaging said specimen S with increased contrast. It is noted that slit element 8 may still be moved within one of the sub-beams, if desirable. For example, slit element 8 may be set to block sub-beam 5c or other parts of the array of sub-beams 5.

Inventors found that the ZLP-filtering as described under reference to FIG. 3 improves contrast even for very thin samples (<30 nm). This is not in line with what general understanding teaches, wherein ZLP-filtering can only boost contrast in thick specimens. Inventors found that the boost of contrast in SPA as obtained by ZLP-filtering does in fact not come from the removal of the fuzzy background, but instead from the significant difference in inelastic scattering between the particle and the surrounding ice in which it is embedded.

Figure 5A:
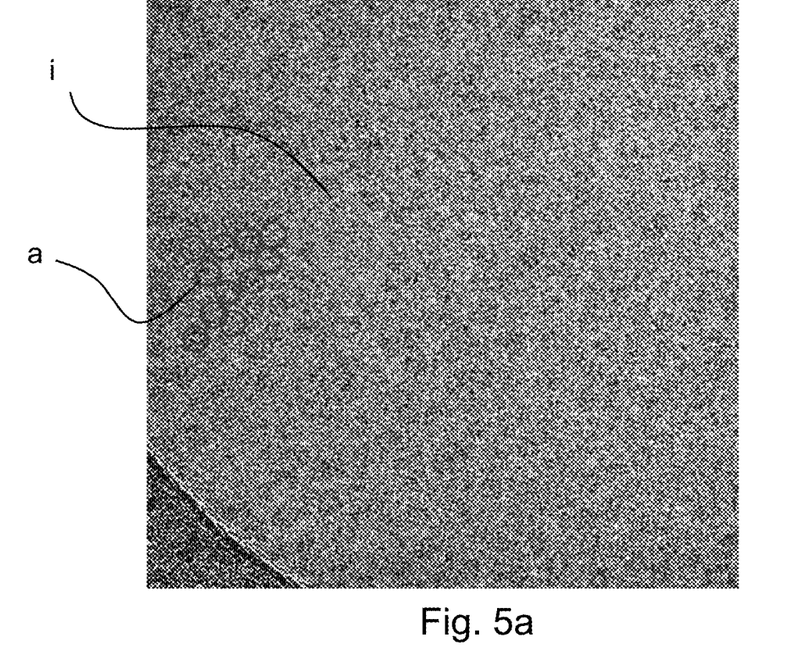
FIG. 5a-5c show images obtained with the spectroscopic apparatus of FIG. 2-4, at corresponding different settings.
Figure 5B:
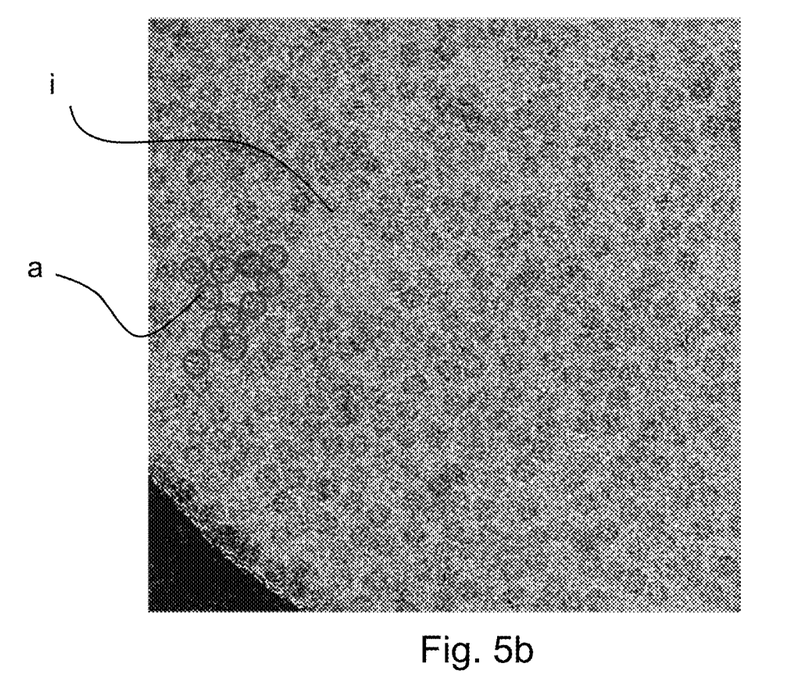
Figure 5C:
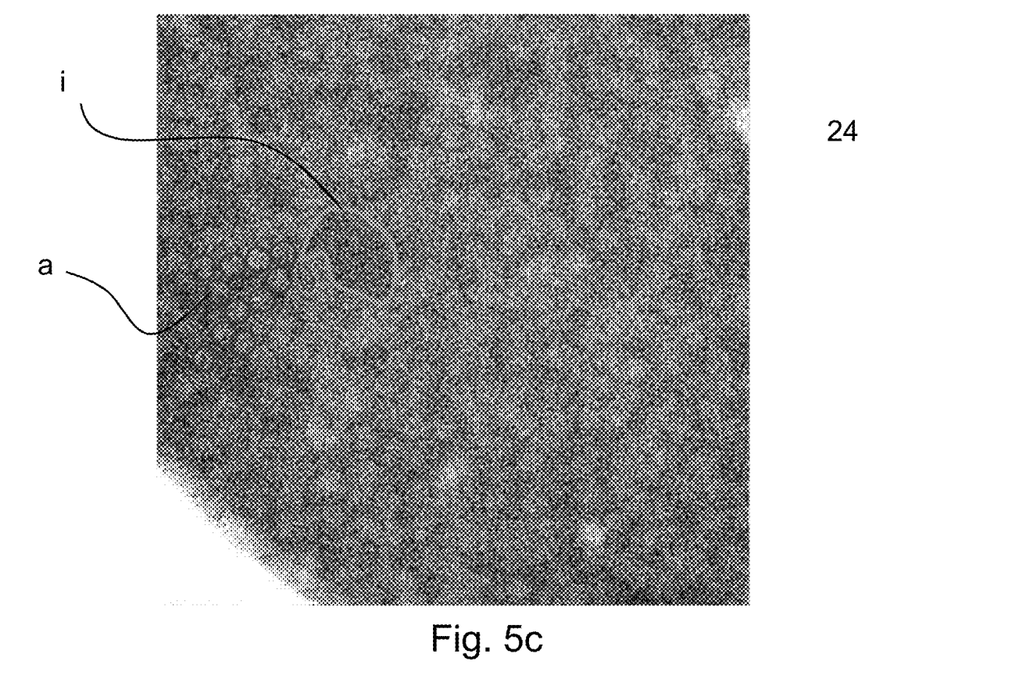

The above is demonstrated with the following experimental results. An electron microscope M was used for acquiring images of a specimen S. Apoferritin particles embedded in amorphous ice were used as a specimen S. The microscope M was set to typical conditions for SPA acquisition, as known to those skilled in the art: specimen cooled down to 80 K (to maintain the amorphous structure of the ice and to minimize radiation damage), parallel illumination with a diameter of 500 nm, electron flux 8 electrons/Å/s, illumination time 5 s. Images were taken, using the same optical set-up for each image, but using different energy filtered fluxes of charged particles, as obtained by using different positions for the slit elements 7,8. The set-ups of FIGS. 2 to 4 are used, and the corresponding results are shown in FIGS. 5a-5c.

In the first image (FIG. 5a) no slit 7, 8 is inserted and the image is made using all electrons (non-scattered, elastic, and inelastic) in the beam. This corresponds to the set-up shown in FIG. 2. Apoferritin particles a (some of which are indicated using circles, for increased legibility) are hardly distinguishable from icy regions i (one of which is indicated for increased legibility).

In the second image (FIG. 5b), the slit is inserted to the position used for ZLP filtering, passing only the non-scattered and elastically scattered electrons (±10 eV). This corresponds to the set-up shown in FIG. 3. Clearly, the ZLP-filtering (FIG. 5b) renders the apoferritin a clearly visible. In order to maximize clarity, images were processed to remove all spatial frequencies beyond ½ nm, although it should be noted that the unprocessed images also clearly show that ZLP-filtering boosts the recognizability of the apoferritin.

In the third image (FIG. 5c), the upper slit edge 8 is fully retracted, and the lower slit edge 7 is moved to the original position of the upper edge. This blocks the non-scattered and elastically scattered electrons and passes only the inelastic electrons. This corresponds to the set-up shown in FIG. 4. The icy region i and the apoferritin particles a are somewhat distinguishable as well.

Figure 5D:
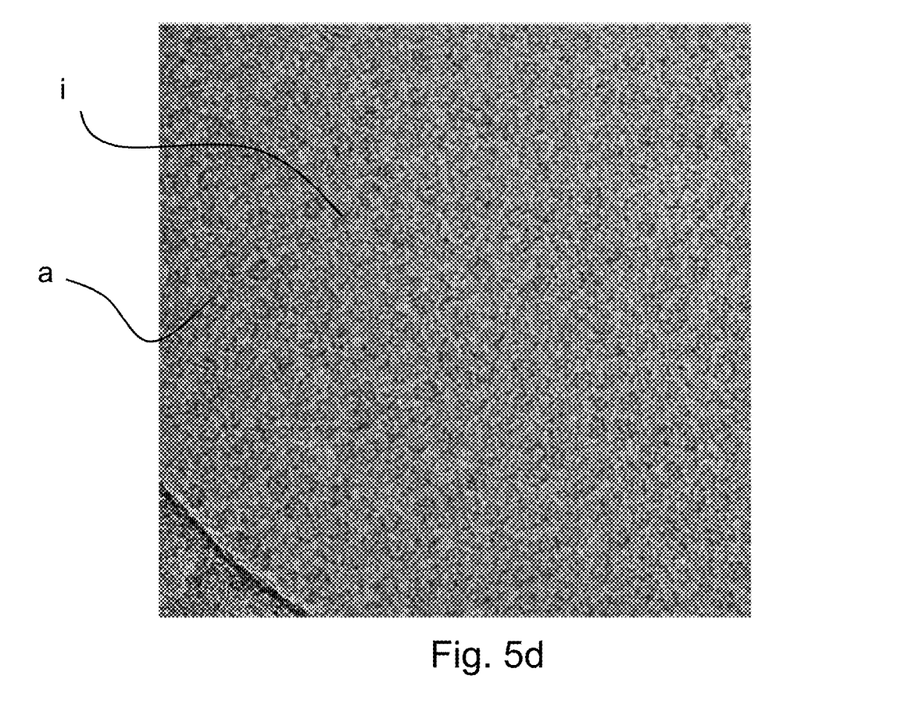

FIG. 5d shows the sum of the images shown in FIGS. 5b and 5c, i.e. the sum of the ZLP-filtered image and the ZLP-blocked image. As expected, the sum of the ZLP-filtered image and the ZLP-blocked image (FIG. 5d) closely resembles the unfiltered image (FIG. 5a), including the (near) absence of contrast between the apoferritin and the ice. Thus, the apoferritin, which is well recognizable in the ZLP-filtered image, can be made unrecognizable by adding the ZLP-blocked image to the ZLP-filtered image. From this it can be inferred that the ZLP-blocked image must also carry some powerful information.

Figure 6:
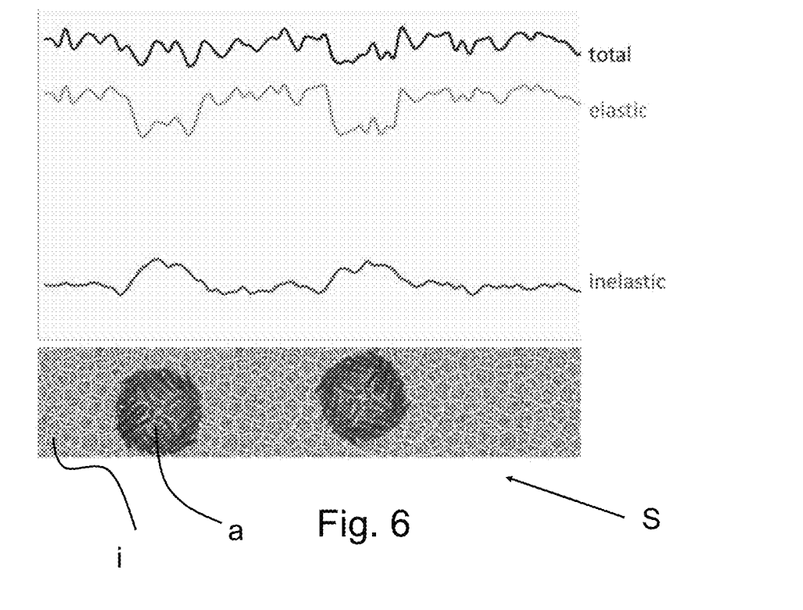
FIG. 6 shows a schematic overview of total, elastic and inelastic signal within a specimen comprising an icy layer and particles embedded therein.

FIG. 5c reveals the nature of this information: precisely at the position of the particles, the inelastic signal is higher. Logically, this increase of intensity of the inelastic signal is accompanied by a corresponding decrease of intensity in the elastic signal. This decreased intensity (together with the high-frequency information) makes the particles recognizable in the ZLP-filtered image (FIG. 5b). FIG. 6 schematically sketches this increase of intensity of the inelastic signal at the apoferritin particle a, and the corresponding decrease of intensity in the elastic signal (that is, the non-scattered and the elastically scattered electrons) at the apoferritin particle a. From FIG. 6 it can thus be inferred that both the elastic signal and the inelastic signal comprise information on features in the specimen S, in this case the presence of particles a in the icy layer i.

From EELS spectroscopy, it is known that the inelastic signal is dominated by plasmon losses, which occur around 10 eV . . . 40 eV energy loss. Inventors conclude from FIG. 5c that the plasmon interaction in the apoferritin must be stronger than in the ice. Plasmons are collective oscillations of the valence electrons in the specimen. According to Egerton (Egerton, R. F., 2011. *Electron Energy-Loss Spectroscopy in the Electron Microscope.* doi:10.1007/978-1-4419-9583-4) "The essential requirement for plasmon excitation is that the participating electrons can communicate with each other and share their energy, a condition that is fulfilled for a band of delocalized states but not for the atomic-like core levels." Inventors hypothesize that the plasmons are less likely to be excited in amorphous ice than in the particle because the loose and irregular structure of the ice makes that the electrons can communicate less well with each other than in the particle.

The first and second recorded energy filtered flux may be used for imaging said specimen with increased contrast. In view of the above, an embodiment of the invention uses the information available in the ZLP-filtered image (that is, the high frequency information and the plasmon contrast) and in the ZLP-blocked image (that is, the plasmon contrast), by:

First, recording a ZLP-filtered image at roughly the maximum dose the specimen can stand before losing structural integrity (typically 40 e/Å$^2$ at 300 kV beam potential); and then Second, at the same position, record a ZLP-blocked image of similar (or higher) dose.

The plasmon signal in the ZLP-blocked image improves the accuracy with which the particles, or more generally regions of interest in the specimen, can be located. This can be done in many ways. It is conceivable that the plasmon image is processed for locating the particles, for example, and using this information to locate the particles in the ZLP-filtered image and/or enhance the ZLP-filtered image.

Figure 7:
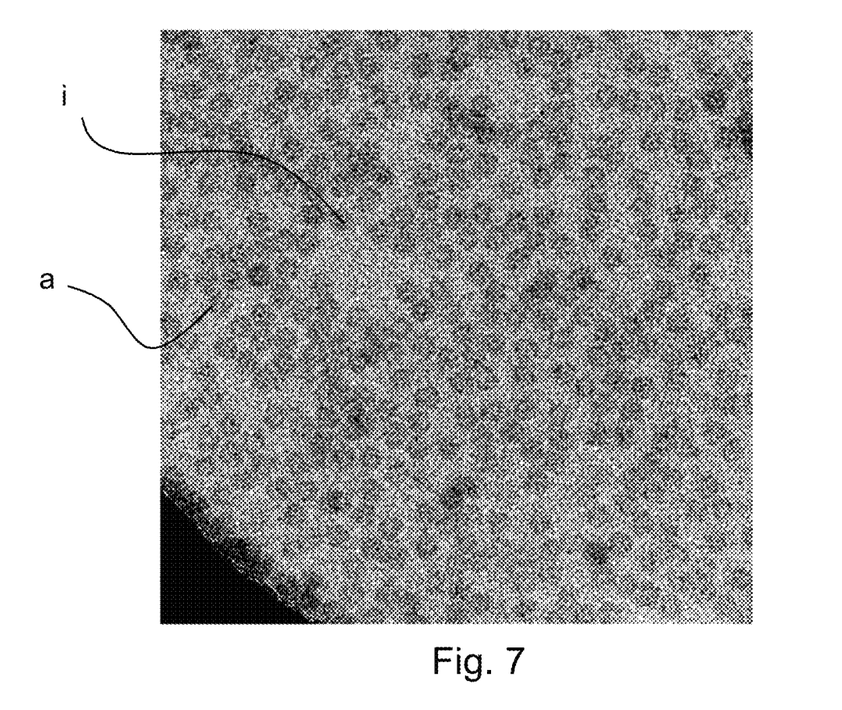

In another embodiment, the plasmon image is subtracted from the ZLP-filtered image. An example of such modification is shown in FIG. 7. Here, the ZLP-blocked image (FIG. 5c) is subtracted from the ZLP-filtered image (FIG. 5b). This yields a high-quality image with higher contrast between particles and the ice they are embedded in. This image may then be digitally processed and/or analysed for identifying the particles. In an embodiment, the particles that are imaged and identified can be used for forming a three-dimensional (3D) reconstruction of said sample particle. Here, use is made of said first and second energy filtered flux of charged particles by, for example, subtracting the ZLP-blocked image from the ZLP-filtered image.

The plasmon image may be tuned by a factor before the subtraction. The factor may be optimized for maximum contrast.

It may be noted that, although the ZLP-blocked image is recorded on a part of the specimen that already suffered some radiation damage, this is not limiting because the plasmon signal does not need to (and cannot) carry high-frequency information. Therefore, it is acceptable to use the maximum dose for obtaining the ZLP-filtered image.

It is noted that the first energy filtered flux may, in principle, comprise any selected sub-spectrum of the total spectrum, as long as it includes elastically scattered charged particles. In an embodiment, it is conceivable that the distance between, and the position of, the slit elements 7, 8 is chosen in such a way as to optimize image results. The same holds true for the distance and position of the slit elements for generating the second energy filtered flux. In other words, the optimum position for the boundary between ZLP-filtered and ZLP-blocked image may be changed and empirically determined to render optimum image results. This is helpful in case a yet unknown particle or specimen is imaged. In this case it can be helpful to acquire a small series of images with different slit widths before the actual SPA acquisition is started.

Generating and recording a second energy flux of charged particles, such as capturing, for example, a ZLP-blocked image, takes additional time, and this increases throughput time by some factor depending on the time needed per stage movement and the time needed per exposure. This effect can be countered by the fact that for some samples, 1000 elastic images and 1000 inelastic images give better reconstruction than 2000 elastic images. Additionally, in an embodiment the beam current can be raised when acquiring the inelastic image, which reduces the acquisition time for the inelastic image. For small particles, the traditional acquisition method requires high-quality thin ice. It takes a lot of time for grid screening to find the thin ice (if present). With the information in the inelastic image, intermediate or thicker ice can be used, thus effectively increasing throughput. As a final note, the throughput time is a less relevant parameter when, for some reason, the sample has only a limited number of particles (say, less than 1000) in which case it is desirable to have all information of each available particle, irrespective of throughput time.

The desired protection is determined by the appended claims.

The invention claimed is:

1. Method of imaging a specimen using a transmission charged particle microscope, said method comprising:
providing the specimen;
directing a charged particle beam onto said specimen;
filtering out inelastically scattered charged particles from a flux of charged particles transmitted through the specimen based on energy-loss to obtain a first energy filtered flux of the charged particles transmitted through the specimen, wherein said first energy filtered flux substantially consists of non-scattered and elastically scattered charged particles;
detecting the first energy filtered flux;
filtering the flux of charged particles transmitted through the specimen based on energy-loss to obtain a second energy filtered flux of the charged particles transmitted through the specimen, wherein said second energy filtered flux of charged particles substantially consists of inelastically scattered charged particles;
generating an image of the specimen based on said detected first energy filtered flux and said detected second energy filtered flux.

2. Method according to claim 1, wherein filtering the flux of charged particles transmitted through the specimen based on energy-loss includes dispersing the flux of the transmitted charged particles into an energy-resolved array of spectral sub-beams, and filtering parts of the fluxes of the sub-beams.

3. Method according to claim 2, wherein detecting the first energy filtered flux and detecting the second energy filtered flux includes detecting the filtered sub-beams.

4. Method according to claim 1, wherein the first energy filtered flux is detected when a dose of the charged particles at the specimen is at a first dose, and the method further comprising: after detecting the first energy filtered flux, adjusting the dose of the charged particles at the specimen to a second dose, and detecting the second energy filtered flux.

5. Method according to claim 4, wherein the first dose equals a maximum dose the specimen can stand before losing structural integrity.

6. Method according to claim 4, wherein the first dose is equal or greater than 40 e/$Å^2$.

7. Method according to claim 4, wherein the second dose is higher than the first dose.

8. Method according to claim 4, wherein said second dose is equal to said first dose.

9. Method according to claim 1, wherein the specimen is cryo frozen and includes particles embedded in ice, and the method further comprising locating the particles using said detected second energy filtered flux.

10. Method according to claim 1, wherein generating the image of the specimen based on said first and second detected energy filtered flux comprises generating the image of the specimen by subtracting the detected second energy filtered flux from said detected first energy filtered flux.

11. Method according to claim 10, further comprising applying a scaling factor on said recorded second energy filtered flux of charged particles before subtracting the detected second energy filtered flux from said detected first energy filtered flux.

12. Transmission charged particle microscope, comprising:
A charged particle beam source for emitting a charged particle beam;
A specimen holder for holding a specimen;
An illuminator;
A detector;
A dispersive device for dispersing a flux of the transmitted charged particles into an energy-resolved array of spectral sub-beams;
One or more slit elements; and
A control unit connected to the illuminator, the dispersive device, and the detector wherein the control unit is arranged to:
direct, via the illuminator, the charged particle beam emitted from the charged particle beam source onto the specimen;
adjust the slit element to filter out inelastic scattered charged particles from the spectral sub-beams and obtain a first energy filtered flux of the transmitted charged particles, wherein the first energy filtered flux substantially consists of non-scattered and elastically scattered charged particles;

detect, via the detector, the first energy filtered flux;

adjust the slit element to filter the spectral sub-beams and obtain a second energy filtered flux of the transmitted charged particles, wherein the second energy filtered flux substantially consists of inelastically scattered charged particles;

detect, via the detector, the second energy filtered flux; and generate an image of the specimen based on the first energy filtered flux and the second energy filtered flux.

13. The microscope of claim 12, wherein generating an image of the specimen based on the first energy filtered flux and the second energy filtered flux includes generating the image based on a difference between the first energy filtered flux and the second energy filtered flux weighted by a scaling factor.

14. The microscope of claim 12, wherein the first energy filtered flux is detected while irradiating the specimen at a first dose, and wherein the first dose equals a maximum dose the specimen can stand before losing structural integrity.

15. The microscope of claim 12, wherein the controller is further arranged to determine slit widths before directing the charged particle beam onto the specimen, and adjusting the slit elements includes adjusting the slit elements to the determined slit widths.

\* \* \* \* \*